United States Patent
Lin et al.

(10) Patent No.: US 7,842,591 B2
(45) Date of Patent: Nov. 30, 2010

(54) METHOD OF FABRICATING SHORT-GATE-LENGTH ELECTRODES FOR INTEGRATED III-V COMPOUND SEMICONDUCTOR DEVICES

(75) Inventors: Cheng-Kuo Lin, Tao Yuan Shien (TW); Chia-Liang Chao, Tao Yuan Shien (KR); Ming-Chang Tu, Tao Yuan Shien (TW); Tsung-Chi Tsai, Tao Yuan Shien (TW); Yu-Chi Wang, Tao Yuan Shien (TW)

(73) Assignee: WIN Semiconductors Corp. (TW)

( * ) Notice: Subject to any disclaimer, the term of this patent is extended or adjusted under 35 U.S.C. 154(b) by 202 days.

(21) Appl. No.: 12/153,206

(22) Filed: May 15, 2008

(65) Prior Publication Data
US 2008/0220599 A1 Sep. 11, 2008

Related U.S. Application Data

(63) Continuation-in-part of application No. 11/446,206, filed on Jun. 5, 2006, now abandoned.

(51) Int. Cl.
H01L 21/28 (2006.01)
(52) U.S. Cl. .................. 438/579; 438/182; 438/574; 438/949; 438/950; 257/183.1; 257/194; 257/197; 257/E21.205; 257/E29.189

(58) Field of Classification Search .............. 438/571, 438/572, 182, 574, 579, 949, 950; 257/E21.186, 257/E21.407, 183, 183.1, 194, 195, 197, 257/198, 201, E21.205, E29.189, E29.25
See application file for complete search history.

(56) References Cited

U.S. PATENT DOCUMENTS

| | | | | |
|---|---|---|---|---|
| 5,288,660 A * | 2/1994 | Hua et al. | .................. | 438/571 |
| 6,078,067 A * | 6/2000 | Oikawa | .................. | 257/192 |
| 2003/0116782 A1* | 6/2003 | Mizutani | .................. | 257/183 |
| 2005/0184310 A1* | 8/2005 | Krutko et al. | .................. | 257/197 |
| 2006/0102932 A1* | 5/2006 | Hwang | .................. | 257/194 |

* cited by examiner

Primary Examiner—Hung Vu
Assistant Examiner—Vernon P Webb
(74) Attorney, Agent, or Firm—Bacon & Thomas, PLLC

(57) ABSTRACT

A method of fabricating short-gate-length electrodes for integrated III-V compound semiconductor devices, particularly for integrated HBT/HEMT devices on a common substrate is disclosed. The method is based on dual-resist processes, wherein a first thin photo-resist layer is utilized for defining the gate dimension, while a second thicker photo-resist layer is used to obtain a better coverage on the surface for facilitating gate metal lift-off. The dual-resist method not only reduces the final gate length, but also mitigates the gate recess undercuts, as compared with those fabricated by the conventional single-resist processes. Furthermore, the dual-resist method of the present invention is also beneficial for the fabrication of multi-gate device with good gate-length uniformity.

8 Claims, 7 Drawing Sheets

Coating and exposing a first PR layer

- Metal
- 1st PR
- 2nd PR
- Low doping AlGaAs layer

Removing PR layers and metal lift-off

- Metal
- PR
- High doping GaAs Layer
- Low doping AlGaAs layer

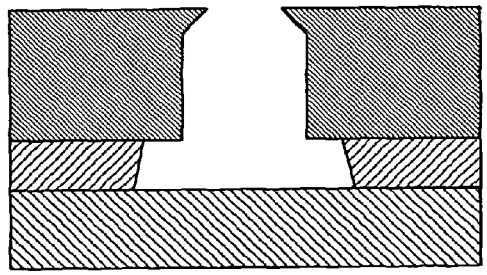
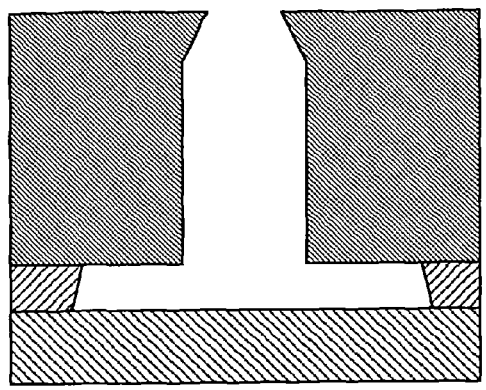
FIG. 3(a)  FIG. 3(b)
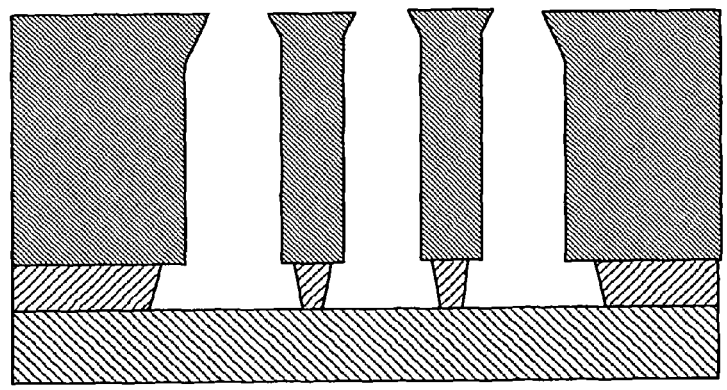
FIG. 3(c)
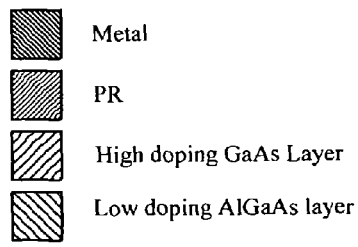

- Metal
- 1st PR
- 2nd PR
- Low doping AlGaAs layer

Coating and exposing a first PR layer

Reshaping opening

Coating a second PR layer

Depositing gate metal

Removing PR layers and metal lift-off

METHOD OF FABRICATING SHORT-GATE-LENGTH ELECTRODES FOR INTEGRATED III-V COMPOUND SEMICONDUCTOR DEVICES

CROSS REFERENCE TO RELATED DOCUMENTS

The present invention is a continuation-in-part (CIP) of U.S. application Ser. No.11/446,206, of which the entire disclosure of the pending, prior application is hereby incorporated by reference, entitled "A Structure and a Method for Monolithic Integration of HBT, Depletion-mode HEMT and Enhancement-mode HEMT on the Same Substrate", filed on Jun. 5, 2006, now abandoned.

BACKGROUND OF THE INVENTION

1. Field of the Invention

The present invention relates in general to integrated devices made of III-V compound semiconductors and, in particular, to a method of fabricating short-gate-length electrodes for heterojunction field-effect transistors (HFETs) integrated with heterojunction bipolar transistors (HBTs) on a common substrate.

2. Background of the Invention

Integration of multifunction circuit devices, which include more than one device type on a common substrate, in certain applications (such as microwave, millimeter wave, and optoelectronic application) not only increases the performance of the integrated circuits, but also provides a practical solution to achieve greater cost and space reduction. For example, by integrating HBTs and HFETs, such as high-electron-mobility transistors (HEMTs) in general, and pseudomorphic HEMT (pHEMTs) in particular, the low-noise advantages of HEMTs together with the high-power and high-linearity features of HBTs provide microwave circuits with lower noise and higher power than those realized by separately fabricating HEMTs and HBTs in known baseline fabrication techniques and then combining into hybrid circuits.

A number of attempts have been made to integrate HBTs and HFETs on the same substrate. One practical way of such monolithic integrations has been realized by utilizing a stacked-layer structure containing HBT layers on the top of HEMT layers. To fabricate HEMT devices, the top HBT layers must be etched away, followed by a number of processes, such as deposition of gate metal, alloying source/drain metal contacts, as well as passivations and isolations. However, because HBT layer structures are usually very thick (typically >2 μm), the resulting surface topography will show a large difference between the HBT mesa and the region for HEMT devices. Such a large topographical difference considerably limits the minimum attainable gate length and source/drain-to-gate or gate-to-gate spacing during the fabrication of HEMT devices.

Conventionally, the process for fabricating gate electrodes on HEMT consists of a number of steps, including the definition of gate region using photolithography, such as photoresist (PR) coating, exposure and developing, followed by gate recess wet etching, gate metal deposition, and gate metal lift-off processes. The developed PR pattern for the gate region is trench shaped, which usually displays a narrower opening 11, but a wider base dimension 12, as shown in FIG. 1(a). Furthermore, because the wet etching process is isotropic, typical gate recess also shows undercuts 13, as illustrated in FIG. 1(b). Wider gate recess undercut is detrimental to device high frequency characteristics and has reliability concern due to unstable surface-state on AlGaAs or GaAs layer. On the other hand, although the desired gate length is defined by the narrower opening 11 of the PR trench, the resulting gate length 14 is usually wider than that due to the PR undercuts. FIGS. 2(a) and (b) show the cross-sectional SEM (scanning electron microscopy) images of the fabricated PR trench for defining gate region, and the resulting gate metal electrode and gate recess undercuts, respectively. A widening in gate recess undercuts and gate length can clearly seen in FIG. 2(b).

For the fabrication of integrated HBT/HEMT devices, using the conventional method to fabricate gate electrodes will make the situation even worse, due to the large topographical difference. Using a thinner PR thickness usually leads to a poor coating near the interface between HBT and HEMT devices, and results in gate distortion. However, when a thicker PR thickness was used in order to obtain better coverage, the large aspect ratio of the PR gate trench will further widen the gate recess undercuts and limit the minimum attainable gate length. In addition, the conventional method also makes the fabrication of multiple gates for such integrated HBT/HEMT devices more difficult and hard to control, as schematically shown in FIG. 3. It can be seen that the PR adhesion on the region between gates will be an issue for mass production.

Therefore, it is necessary to develop a method for fabricating short-gate-length electrodes with reduced gate recess undercuts for integrated HBT/HEMT devices with high topographical differences.

SUMMARY OF THE INVENTION

It is an object of the present invention to provide a method of fabricating gate electrodes for integrated III-V semiconductor devices, particularly for integrated HBT and HEMT devices with large difference in surface topography.

In order to achieve the above-described objects, the present invention provides a method of dual resist process for fabricating short gate length electrodes on HEMT devices in the vicinity of HBT devices. It comprises the steps of:

coating a first PR layer, followed by exposing and developing a first gate trench thereon for defining a gate region for gate electrodes;

reshaping the first gate trench to a wider opening but with a narrower base dimension for determining final gate length;

coating a second PR layer, followed by exposing and developing a second gate trench located just on the first gate trench;

depositing a metal layer for gate electrodes; and removing the two PR layers and gate metal lift-off, leaving behind a short-gate-length electrode in the final.

BRIEF DESCRIPTION OF DRAWINGS

FIGS. 3(a) to (c) are schematics that highlight the problems of fabricating gate electrodes of integrated HBT and HEMT devices by using the conventional method.

DETAILED DESCRIPTION OF THE INVENTION

Figure 4:
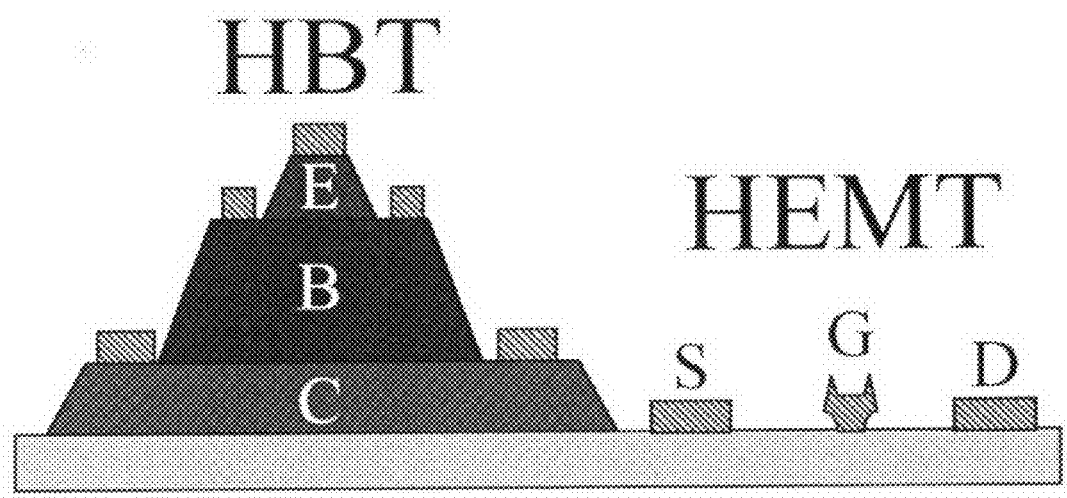
FIG. 4 is a schematic illustrating the cross-sectional view of integrated HBT and HEMT devices.

FIG. 4 depicts a cross-sectional view of an integrated HBT/HEMT device. The right side is the HBT device, while the left side is the HEMT device. Before device fabrications, it is basically a vertically stacked-layer structure, which consists of a set of HBT layers on a set of HEMT layers, grown on a common substrate. Such a stacked-layer structure can be grown by well-known technologies, such as molecular beam epitaxy (MBE), or metalorganic chemical vapor deposition (MOCVD). Between the HBT layers and the HEMT layers, an etching stop layer is inserted in order to facilitate fabrication processes. After providing the stacked-layer structure, the wafer can then be processed into integrated HBT/HEMT devices. The device fabrication starts with processing HBT device by using standard photolithography and wet etchings for defining emitter, base and collector mesas. The etching stop layer is not only for the collector mesa definition, but also for separating the top HBT devices from the bottom HEMT devices. After HBT mesa etchings, metal contacts for collector, base and emitter of the HBT can be formed using standard photolithography and metal lift-off processes. Next, the source and drain ohmic contacts of the HEMT can also be fabricated by using standard photolithography and metal lift-off processes. These metal contacts may be subjected to thermal treatments to achieve good ohmic contacts. The final step is to fabricate gate electrodes of the HEMT between the source and the drain contacts.

Figure 5A:
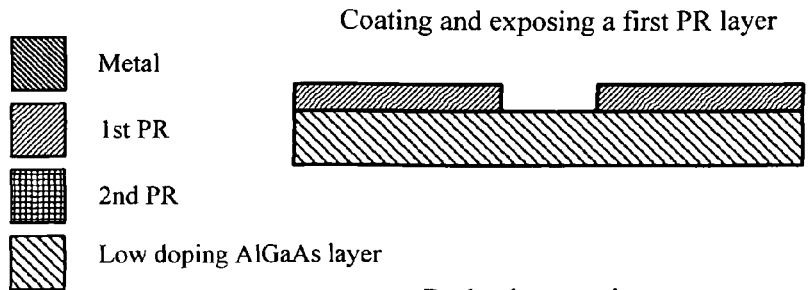
FIGS. 5(a) to (e) are schematics illustrating the process flow of the dual-resist process of the present invention for fabricating short-gate-length electrodes on HEMT devices integrated with HBT devices nearby.
Figure 5B:
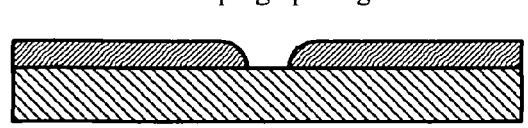
Figure 5C:
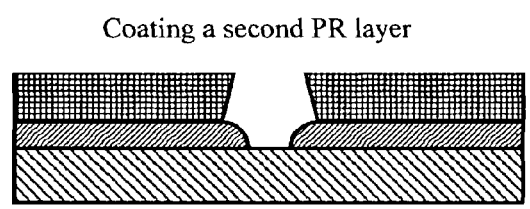
Figure 5D:
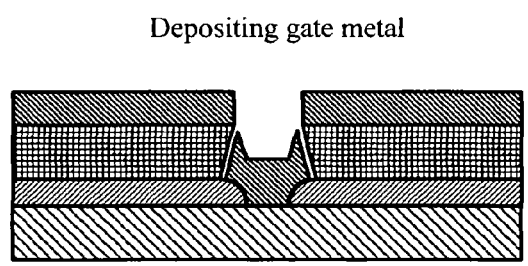
Figure 5E:
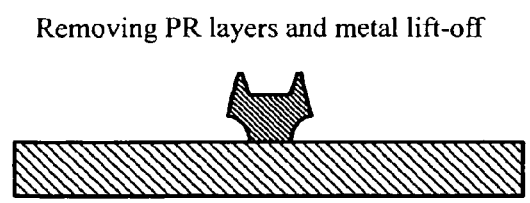
Figure 6:
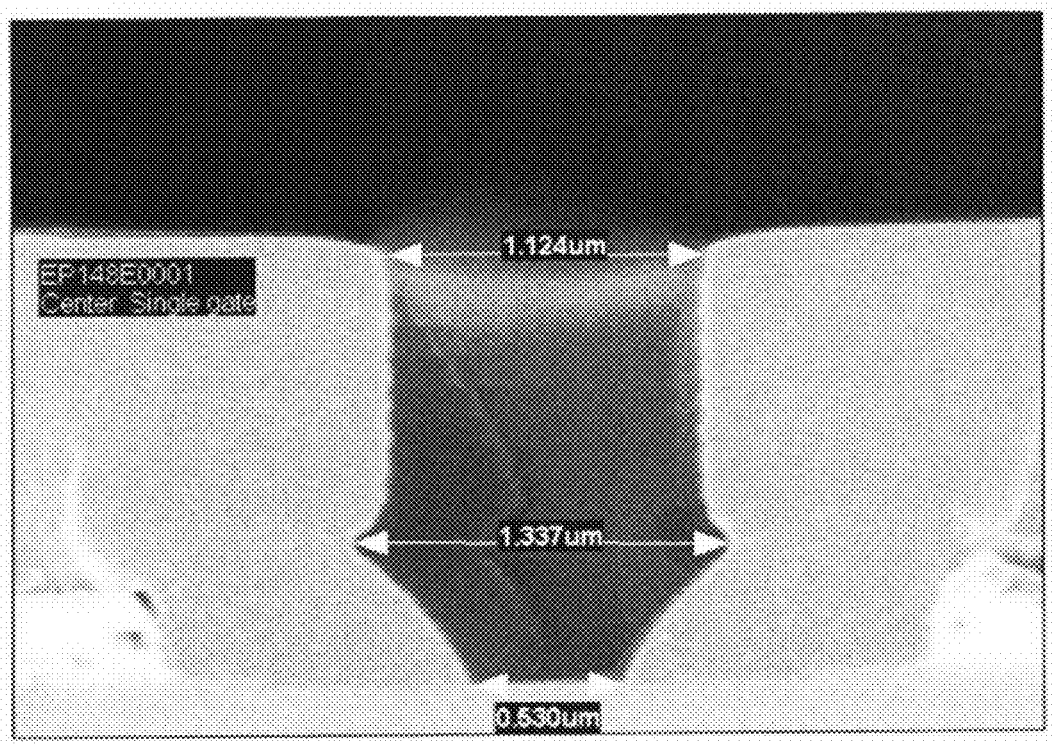
FIG. 6 is the cross-sectional SEM images of the developed gate trench by using the dual-resist processes of the present invention.

In order to fabricate short-gate-length electrodes with less gate recess undercuts for such integrated HBT/HEMT devices, a method based on a dual-resist process is disclosed in the present invention. FIG. 5 is a schematic illustrating the process flow of the dual-resist process. The surface is first coated with a first PR layer, followed by exposing and developing a first gate trench for defining a gate region thereon, as shown in FIG. 5(a). Because the first PR layer is used to define the gate dimension, a thinner thickness (typically <0.5 µm) is preferred. Next, the developed first gate trench on the first PR layer can be further reshaped to a wider opening with narrower base dimension, so that the final gate length can be further reduced, as shown schematically in FIG. 5(b). This reshaping process can be achieved by subjecting the first PR layer to thermal treatments or using chemical solvents, depending on the material property of the first PR layer. After that, a second PR layer is coated on the first one, followed by exposing and developing a second gate trench, which is located upon the first gate trench on the first PR layer, as illustrated in FIG. 5(c). The main purpose of the second PR layer is to facilitate gate metal lift-off process. Therefore, the thickness of the second PR layer must be thick enough (typically >1 µm) in order to obtain a better coverage for such high-topography structures. It is worth to mention that the process for the second PR layer is the same as the conventional single-resist process, which usually leads to a gate trench with a wider base dimension just matching the wider opening of the first gate trench after reshaping. A cross-sectional SEM image of the developed gate trench by using the abovementioned processes is shown in FIG. 6. After the process of the second PR layer, a metal layer for gate electrodes is deposited, as shown in FIG. 5(e). The final step is the removal of the two PR layer and gate metal lift-off, leaving behind a short-gate-length electrode on the HEMT device, as shown in FIG. 5(d).

Figure 1A:
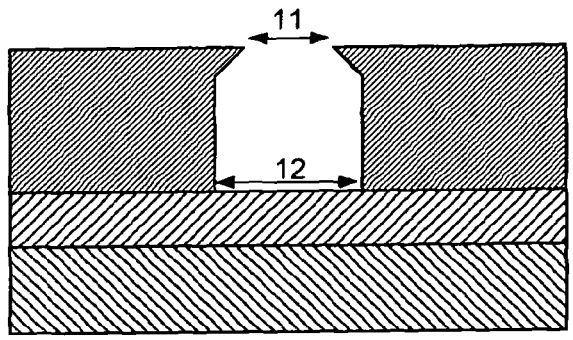
FIGS. 1 (a) to (d) are schematics illustrating the process flow of the conventional method for fabricating gate electrodes on typical FET devices, such as HFET, HEMT and pHEMT devices.
Figure 1B:
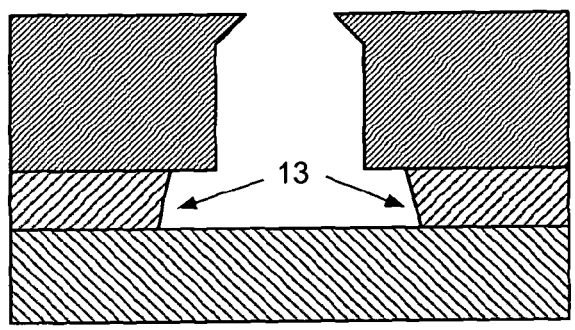
Figure 1C:
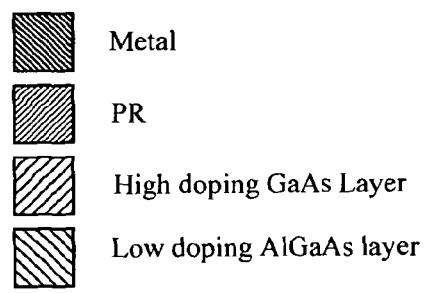
Figure 1C:
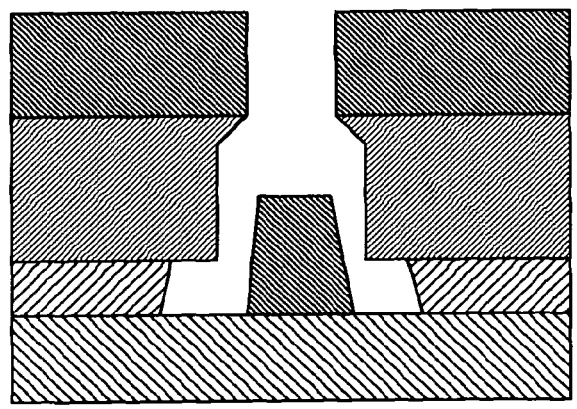
Figure 1D:
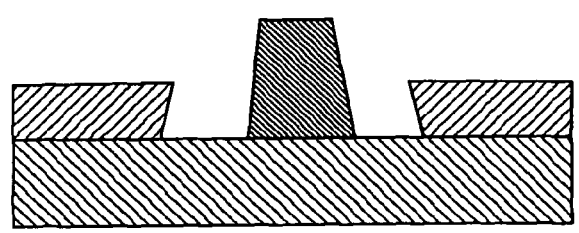
Figure 2A:
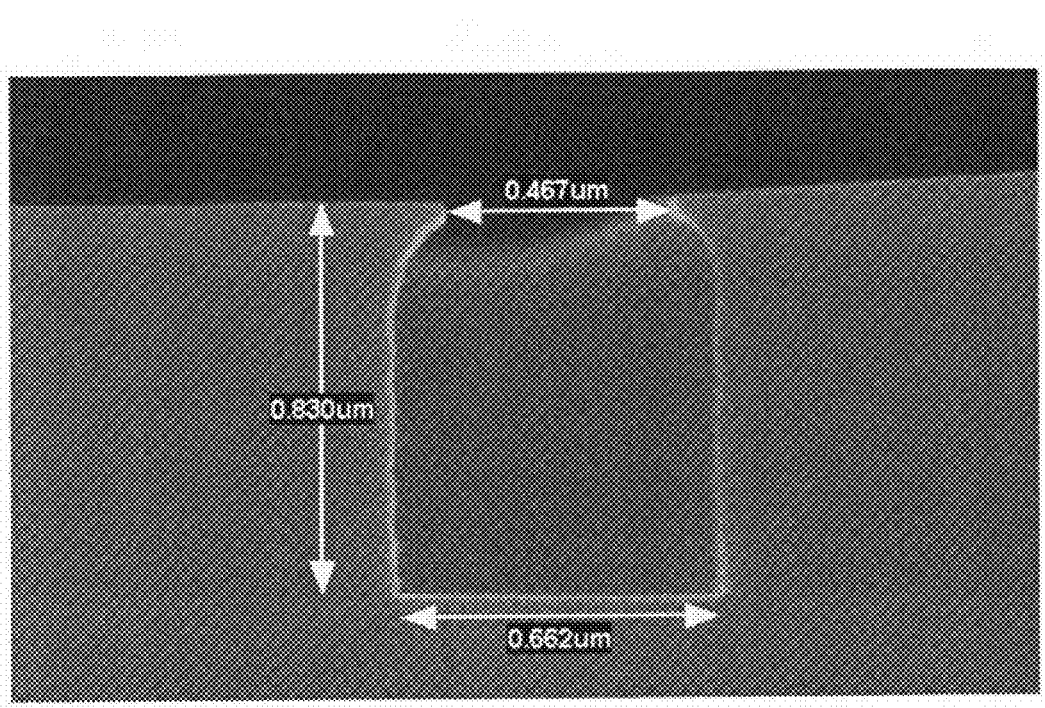
FIGS. 2(a) and (b) are the cross-sectional SEM images of the fabricated PR trench for defining the gate region, and the resulting gate metal electrode and gate recess undercuts, respectively.
Figure 2B:
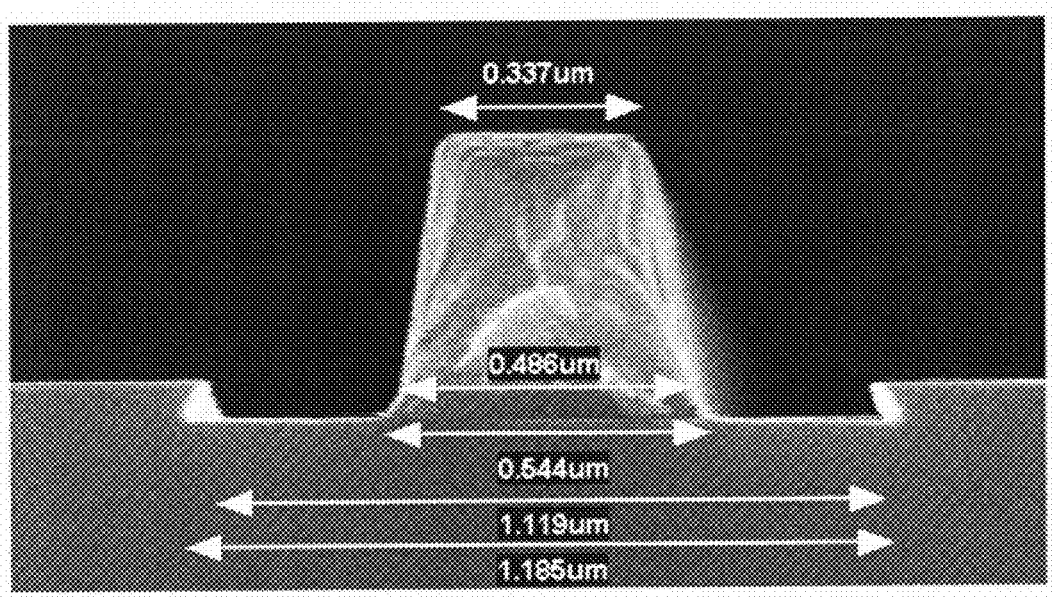
Figure 7A:
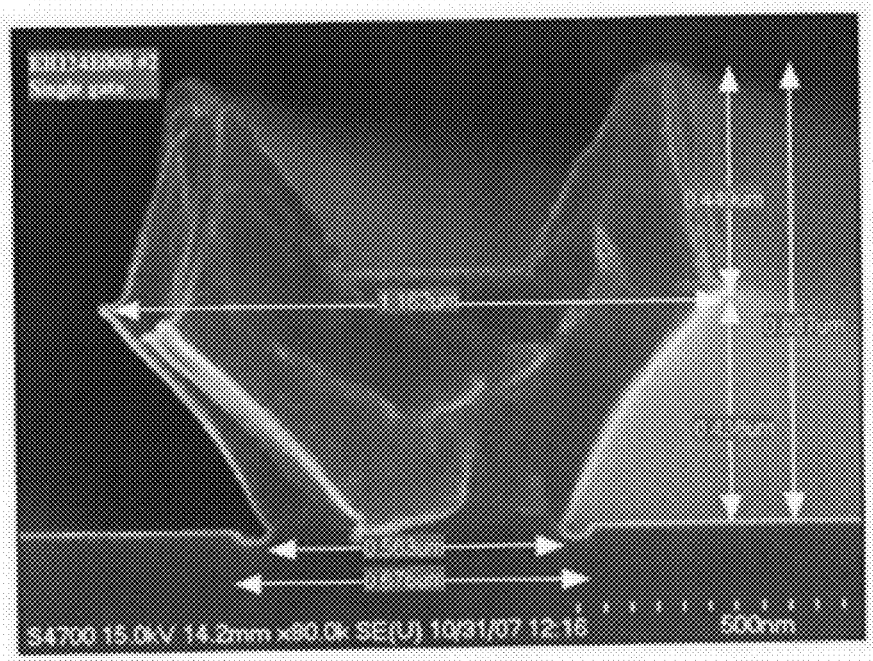
FIG. 7(a) is the cross-sectional SEM image of the fabricated single-gate electrode using the dual-resist processes of the present invention.
Figure 7B:
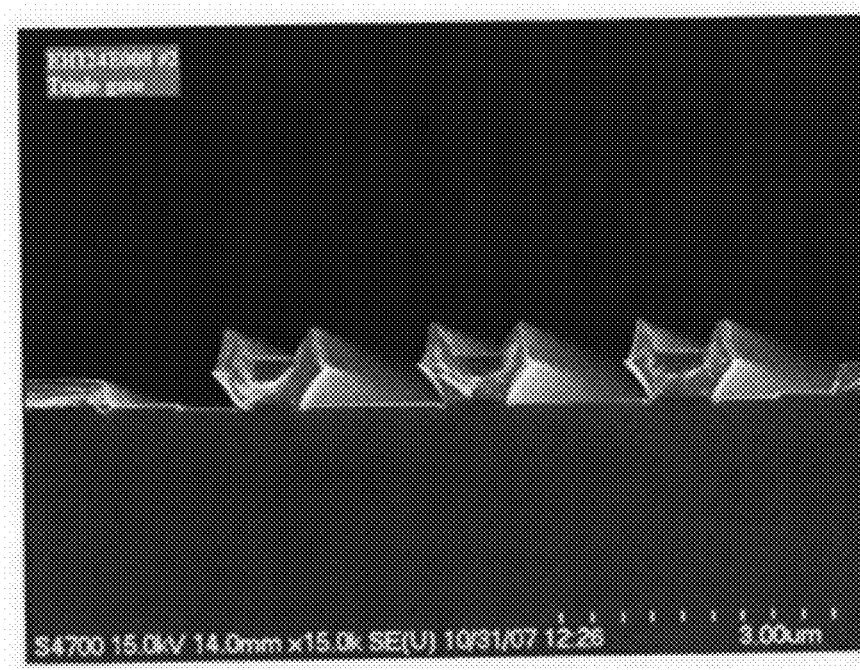
FIG. 7(b) is the cross-sectional SEM image of the fabricated triple-gate electrode using the dual-resist processes of the present invention.

FIG. 7(a) shows a cross-sectional SEM image of the fabricated single-gate electrode using the dual-resist processes of the present invention. It can be clearly seen that not only the final gate length, but also the gate recess undercuts are reduced, as compared with those fabricated by the conventional single-resist processes shown in FIG. 2(b). Furthermore, the dual-resist processes of the present invention facilitate the fabrication of multi-gate device. As shown in FIG. 7(b), it can be clearly seen that a good uniformity within the fabricated triple-gate electrodes was obtained by using the dual-resist processes of the present invention.

As discussed above, the dual-resist processes of the present invention has following advantages:
1. The final gate dimension is determined by the first PR layer so that the gate recess undercut can also be minimized as compared with single-resist processes.
2. The multiple-gate device with uniform gate length can be realized by first thin PR layer.

As disclosed in the above paragraphs, it could be appreciated that the present invention is new and useful.

What is claimed is:

1. A dual-resist method for fabricating gate electrodes of integrated III-V semiconductor devices on a common substrate sequentially comprising the steps of:
    coating a first photo-resist (PR) layer, followed by exposing and developing a first gate trench thereon for defining a gate region for gate electrodes;
    reshaping the first gate trench to a wider opening but with a narrower base dimension for determining final gate length;
    coating a second photo-resist (PR) layer, followed by exposing and developing a second gate trench located just on the first gate trench;
    depositing a metal layer for gate electrodes; and
    removing the two photo-resist (PR) layers and gate metal lift-off, leaving behind a short-gate-length electrode in the final.

2. The method of claim 1 wherein said integrated III-V semiconductor devices include at least two different types of devices on a common substrate.

3. The method of claim 2 wherein said two different types of devices are FET and HBT devices.

4. The method of claim 2 wherein said two different types of devices are HEMT and HBT devices.

5. The method of claim 1 wherein the step of reshaping the first gate trench on the first photo-resist (PR) layer is achieved by thermal treatments.

6. The method of claim 1 wherein the step of reshaping the first gate trench on the first photo-resist (PR) layer is achieved by using chemical solvents.

7. The method of claim 1 wherein the preferred thickness of the first PR layer is not thicker than 0.5 µm.

8. The method according to claim 7 wherein the second PR layer has a thickness of >1 µm.

* * * * *